United States Patent
Katsumata et al.

(10) Patent No.: US 8,120,961 B2
(45) Date of Patent: Feb. 21, 2012

(54) NONVOLATILE SEMICONDUCTOR MEMORY DEVICE

(75) Inventors: Ryota Katsumata, Kanagawa-ken (JP); Masaru Kito, Kanagawa-ken (JP); Yoshiaki Fukuzumi, Kanagawa-ken (JP); Masaru Kidoh, Tokyo (JP); Hiroyasu Tanaka, Tokyo (JP); Yosuke Komori, Kanagawa-ken (JP); Megumi Ishiduki, Kanagawa-ken (JP); Hideaki Aochi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 12/610,703

(22) Filed: Nov. 2, 2009

(65) Prior Publication Data

US 2010/0118610 A1    May 13, 2010

(30) Foreign Application Priority Data

Nov. 13, 2008 (JP) .................................. 2008-291140

(51) Int. Cl.
  *G11C 11/34* (2006.01)

(52) U.S. Cl. ............... 365/185.18; 365/185.27; 257/295

(58) Field of Classification Search ............. 365/185.18, 365/185.27; 257/295, 296, 306, 303, 309, 257/330, 331, 324
See application file for complete search history.

(56) References Cited

U.S. PATENT DOCUMENTS

| | | | |
|---|---|---|---|
| 6,727,544 B2 | 4/2004 | Endoh et al. | |
| 6,870,215 B2 | 3/2005 | Endoh et al. | |
| 7,135,726 B2 | 11/2006 | Endoh et al. | |
| 7,936,004 B2 * | 5/2011 | Kito et al. | 257/324 |
| 2007/0252201 A1 | 11/2007 | Kito et al. | |
| 2008/0079046 A1 * | 4/2008 | Ozaki | 257/295 |

FOREIGN PATENT DOCUMENTS

| | | |
|---|---|---|
| JP | 2007-266143 | 10/2007 |
| JP | 2007-317874 A | 12/2007 |
| JP | 2009-146954 | 7/2009 |
| KR | 10-2006-0060528 A | 6/2006 |
| WO | WO 2009/075370 A1 | 6/2009 |

OTHER PUBLICATIONS

Korean Office Action issued on Feb. 23, 2011 in corresponding Korean Application No. 10-2009-108930 (with an English Translation).
U.S. Appl. No. 13/041,532, filed Mar. 7, 2011, Sasaki, et al.

* cited by examiner

*Primary Examiner* — Dang Nguyen
(74) *Attorney, Agent, or Firm* — Oblon, Spivak, McClelland, Maier & Neustadt, L.L.P.

(57) ABSTRACT

A stacked body with a plurality of dielectric films and electrode films alternately stacked therein is provided. The electrode film is divided into a plurality of control gate electrodes extending in one direction. The stacked body is provided with a U-pillar penetrating through the select gate electrodes and the control gate electrodes, having one end connected to a source line, and having the other end connected to a bit line. Moreover, a different potential is applied to uppermost one of the control gate electrodes than that applied to the other control gate electrodes.

17 Claims, 12 Drawing Sheets

| | PROGRAM OPERATION | | | READ OPERATION | | ERASE OPERATION |
|---|---|---|---|---|---|---|
| | SELECTED | NON-SELECTED | | SELECTED | NON-SELECTED | SELECTED BLOCK |
| BIT LINE BL | VALUE "0"···Vss VALUE "1"···Vdd | | | $V_{b1}$ | | $V_{erase}$ |
| SELECT GATE ELECTRODE SGb | $V_{sg}$ | $V_{off}$ | | $V_{on}$ | $V_{off}$ | $V_{sg}$ |
| CONTROL GATE ELECTRODE CG4 | $V_{pass}$ | $V_{pass}$ | | $V_{read}$ | $V_{read}$ | Vss |
| CONTROL GATE ELECTRODE CG3 | $V_{prg}$ | $V_{prg}$ | | Vss | Vss | Vss |
| CONTROL GATE ELECTRODE CG2 | $V_{pass}$ | $V_{pass}$ | | $V_{read}$ | $V_{read}$ | Vss |
| CONTROL GATE ELECTRODE CG1 | $V_{pass}$ | $V_{pass}$ | | $V_{read}$ | $V_{read}$ | Vss |
| BACK GATE BG | $V_{on}$ | | | $V_{on}$ | | $V_{on}$ |
| CONTROL GATE ELECTRODE CG1 | $V_{pass}$ | $V_{pass}$ | | $V_{read}$ | $V_{read}$ | Vss |
| CONTROL GATE ELECTRODE CG2 | $V_{pass}$ | $V_{pass}$ | | $V_{read}$ | $V_{read}$ | Vss |
| CONTROL GATE ELECTRODE CG3 | $V_{pass}$ | $V_{pass}$ | | $V_{read}$ | $V_{read}$ | Vss |
| CONTROL GATE ELECTRODE CG4 | $V_{pass}$ | $V_{pass}$ | | $V_{read}$ | $V_{read}$ | Vss |
| SELECT GATE ELECTRODE SGs | $V_{off}$ | $V_{off}$ | | $V_{on}$ | $V_{off}$ | $V_{sg}$ |
| SOURCE LINE SL | Vdd | Vdd | | Vss | Vss | $V_{erase}$ |

FIG. 4

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2008-291140, filed on Nov. 13, 2008; the entire contents of which are incorporated herein by reference.

BACKGROUND OF THE INVENTION

1. Field of the Invention

This invention relates to a nonvolatile semiconductor memory device with a plurality of dielectric films and electrode films alternately stacked therein.

2. Background Art

Conventionally, semiconductor memory devices, such as flash memories, have been fabricated by two-dimensionally integrating memory cells on the surface of a silicon substrate. In this type of semiconductor memory device, increase in the packaging density of memory cells is required to reduce cost per bit and increase memory capacity. However, recently, such increase in the packaging density has been difficult in terms of cost and technology.

Methods of stacking memory cells for three-dimensional integration are known as techniques for breaking through the limit of packaging density. However, in the method of simply stacking and patterning layer by layer, increase in the number of stacked layers results in increasing the number of processes and increasing cost. In particular, increase in the number of lithography steps for patterning the transistor structure is a primary factor in increased cost. Thus, reduction in chip area per bit by layer stacking is not so effective in reducing cost per bit as downscaling in the chip surface, and is not suitable as a method for increasing memory capacity.

In view of this problem, the present inventors proposed a simultaneously patterned three-dimensional stacked memory (see, e.g., JP-A-2007-266143(Kokai)). In this technique, select transistors in which vertically extending silicon pillars serve as channels are formed on a silicon substrate, and electrode films and dielectric films are alternately stacked thereon to form a stacked body. Subsequently, through holes are simultaneously formed in this stacked body. A charge storage layer is formed on the side surface of the through hole, and silicon is newly buried inside the through hole so as to be connected to the silicon pillar of the select transistor. Thus, a memory transistor is formed at each intersection between the electrode film and the silicon pillar. Then, select transistors are further formed thereon.

In this simultaneously patterned three-dimensional stacked memory, information can be stored by controlling the potential of each electrode film and each silicon pillar to transfer charge between the silicon pillar and the charge storage layer. In this technique, through holes are formed by simultaneously patterning the stacked body. Hence, increase in the number of stacked electrode films does not result in increasing the number of lithography steps, and cost increase can be limited.

However, in such a simultaneously patterned three-dimensional stacked memory, reading data stored in the memory transistor requires passing a sense current through the silicon pillar. To ensure reliability in reading data, it is necessary to sufficiently decrease the resistance of the connecting portion between the body portion of the select transistor and the body portion of the memory transistor in the silicon pillar. However, this connecting portion includes a polysilicon-polysilicon contact interface, and it is extremely difficult to reduce its contact resistance.

SUMMARY OF THE INVENTION

According to an aspect of the invention, there is provided a nonvolatile semiconductor memory device including: a stacked body with a plurality of dielectric films and electrode films alternately stacked therein, the electrode film being divided into a plurality of control gate electrodes extending in one direction; a plurality of select gate electrodes provided on the stacked body and extending in the one direction; a plurality of semiconductor pillars extending in a stacking direction of the stacked body and penetrating through the control gate electrodes and the select gate electrode; a plurality of source lines extending in the one direction and connected to an upper end portion of a subset of the semiconductor pillars; a plurality of bit lines extending in a direction crossing the one direction and connected to an upper end portion of the remaining semiconductor pillars; a connecting member interconnecting between a lower end portion of one of the semiconductor pillars with the upper end portion connected to the source line and a lower end portion of another of the semiconductor pillars with the upper end portion connected to the bit line; a charge storage layer provided between the control gate electrode and the semiconductor pillar; and a gate dielectric film provided between the select gate electrode and the semiconductor pillar, a different potential being applicable to uppermost one of the control gate electrodes than that applied to the other control gate electrodes.

According to another aspect of the invention, there is provided a nonvolatile semiconductor memory device including: a stacked body with a plurality of dielectric films and electrode films alternately stacked therein, the electrode film being divided into a plurality of control gate electrodes extending in one direction; a plurality of select gate electrodes provided on the stacked body and extending in the one direction; a plurality of semiconductor pillars extending in a stacking direction of the stacked body and penetrating through the control gate electrodes and the select gate electrode; a plurality of source lines extending in the one direction and connected to an upper end portion of a subset of the semiconductor pillars; a plurality of bit lines extending in a direction crossing the one direction and connected to an upper end portion of the remaining semiconductor pillars; a connecting member interconnecting between a lower end portion of one of the semiconductor pillars with the upper end portion connected to the source line and a lower end portion of another of the semiconductor pillars with the upper end portion connected to the bit line; a charge storage layer provided between the control gate electrode and the semiconductor pillar; a gate dielectric film provided between the select gate electrode and the semiconductor pillar; a first potential generation circuit configured to apply a control potential to the control gate electrodes other than the uppermost one of the control gate electrodes; and a second potential generation circuit configured to apply a different potential to the uppermost control gate electrode than the control potential.

BRIEF DESCRIPTION OF THE DRAWINGS

FIG. 4 shows potentials applied to each electrode and interconnect in the operation of the nonvolatile semiconductor memory device according to the embodiment of the invention.

DETAILED DESCRIPTION OF THE INVENTION

An embodiment of the invention will now be described with reference to the drawings.

Figure 1:
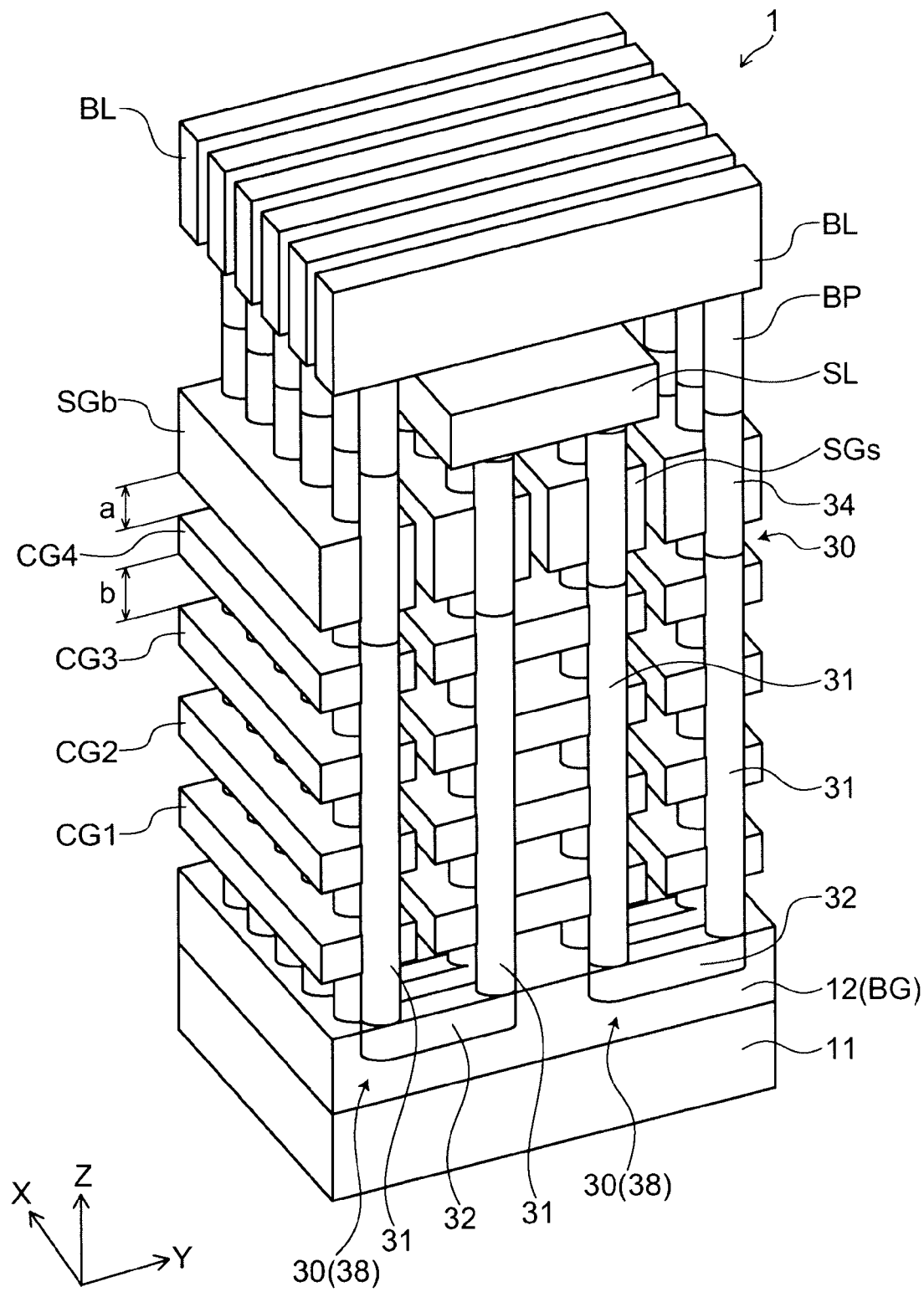
FIG. 1 is a perspective view illustrating a nonvolatile semiconductor memory device according to an embodiment of the invention.

FIG. 1 is a perspective view illustrating a nonvolatile semiconductor memory device according to this embodiment.

Figure 2:
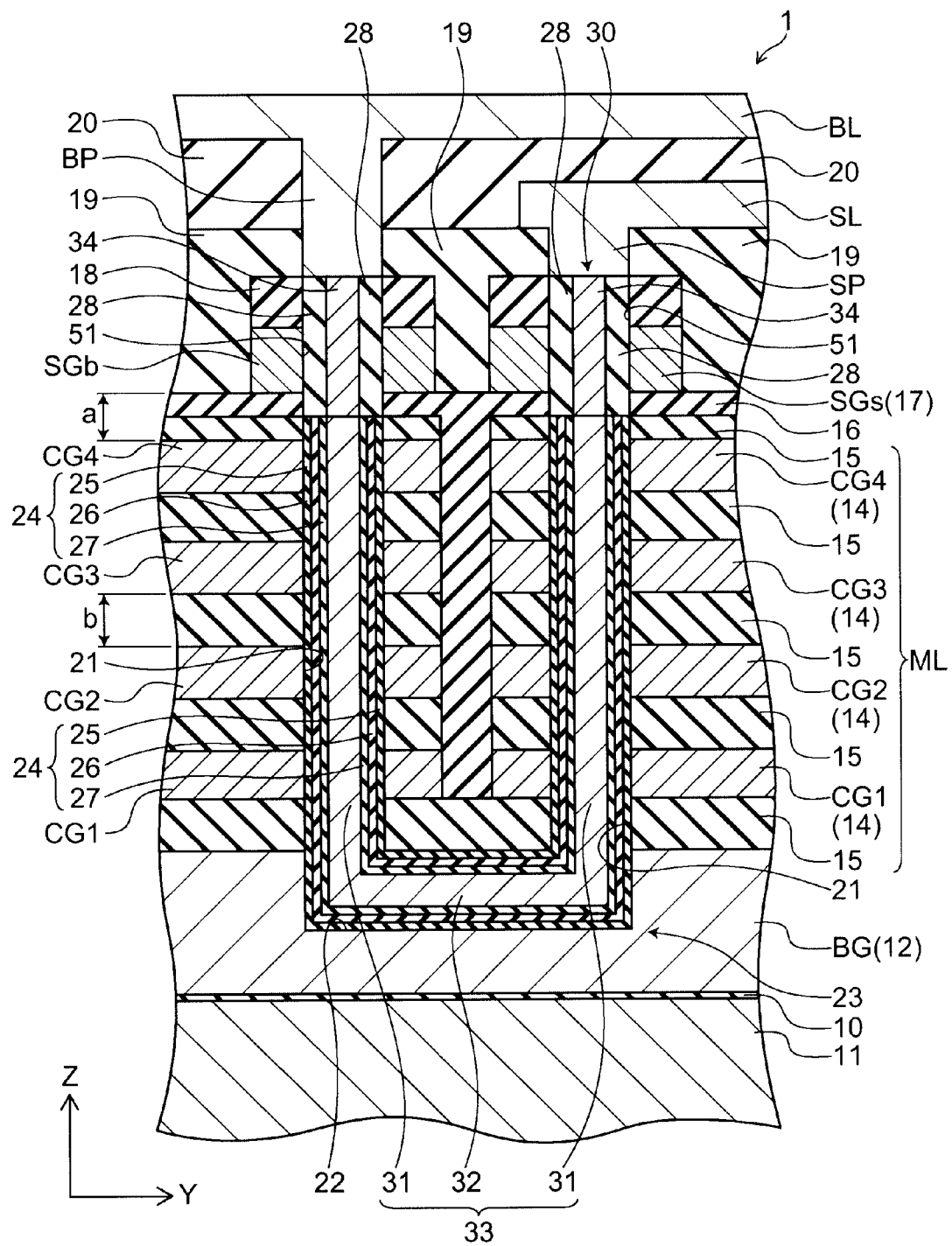
FIG. 2 is a cross-sectional view illustrating the nonvolatile semiconductor memory device according to the embodiment of the invention.

FIG. 2 is a cross-sectional view illustrating the nonvolatile semiconductor memory device according to this embodiment.

Figure 3:
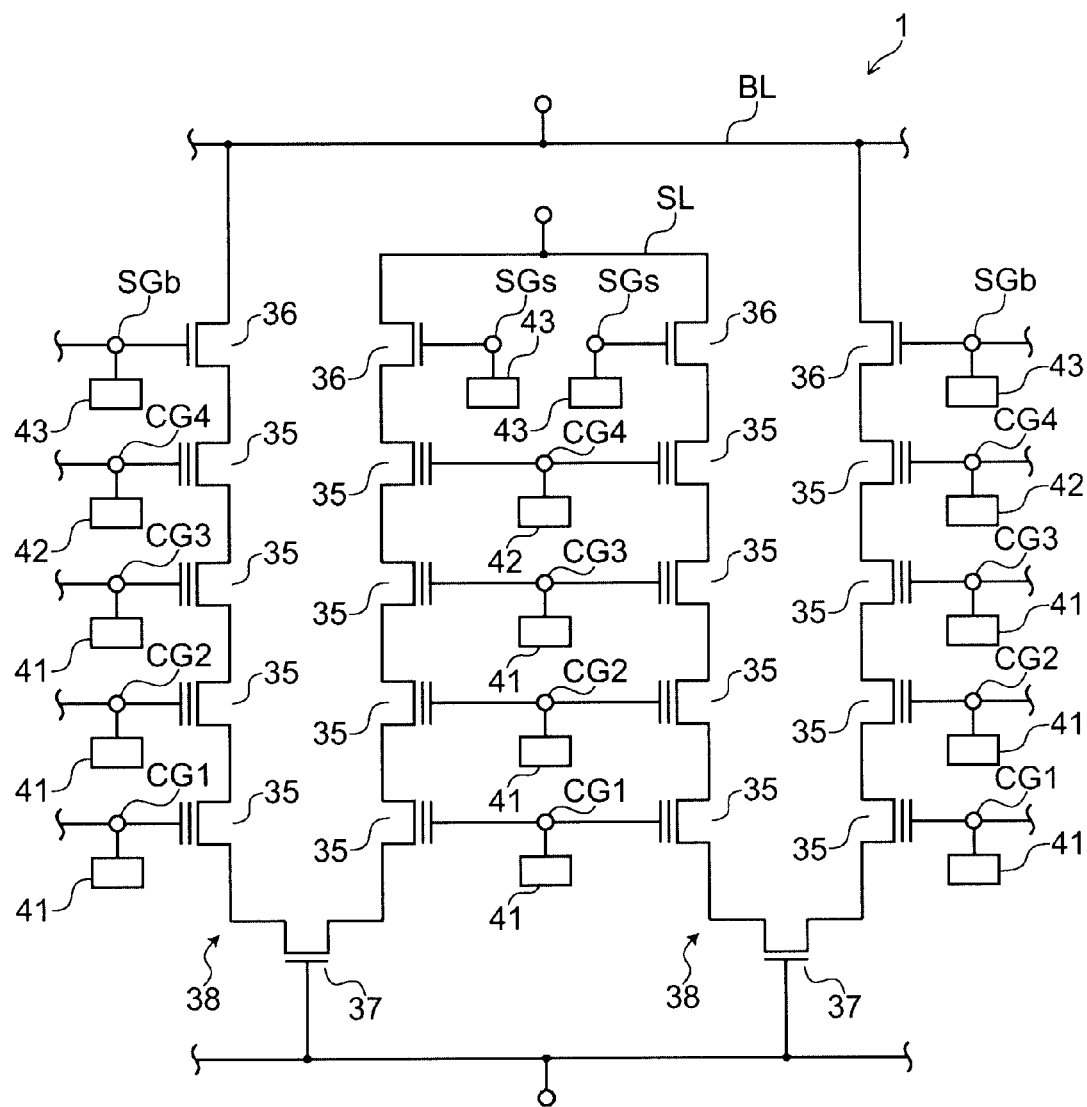
FIG. 3 is a circuit diagram illustrating the nonvolatile semiconductor memory device according to the embodiment of the invention.

FIG. 3 is a circuit diagram illustrating the nonvolatile semiconductor memory device according to this embodiment.

It is noted that in FIG. 1, for clarity of illustration, only the conductive portions are shown, and illustration of the dielectric portions is omitted. Furthermore, FIG. 3 shows a pair of memory strings sharing control gate electrodes.

The nonvolatile semiconductor memory device according to this embodiment is a simultaneously patterned three-dimensional stacked memory device with each memory transistor provided at the intersection between the silicon pillar and the control gate electrode, characterized in that a pair of silicon pillars constitutes a U-pillar, and the memory transistor at the uppermost stage functions as a dummy transistor. In the following, the configuration of this nonvolatile semiconductor memory device is described in detail.

As shown in FIGS. 1 and 2, the nonvolatile semiconductor memory device 1 (hereinafter also simply referred to as "device 1") according to this embodiment includes a silicon substrate 11. The silicon substrate 11 includes a memory cell formation region in which memory cells are formed, and a peripheral circuit region (not shown) in which peripheral circuits are formed. The peripheral circuit region is placed around the memory cell formation region.

In the memory cell formation region, a dielectric film 10 is formed on the silicon substrate 11, and a conductive film, such as a polysilicon film 12, is formed thereon and serves as a back gate BG. A plurality of electrode films 14 and dielectric films 15 are alternately stacked on the back gate BG. The plurality of electrode films 14 and dielectric films 15 constitute a stacked body ML.

In the following, for convenience of description, an XYZ orthogonal coordinate system is herein introduced. In this coordinate system, the two directions parallel to the upper surface of the silicon substrate 11 and orthogonal to each other are referred to as the X and Y direction, and the direction orthogonal to both the X and Y direction, or the stacking direction of the layers, is referred to as the Z direction.

The electrode film 14 is illustratively made of polysilicon and divided along the Y direction into a plurality of control gate electrodes CG extending in the X direction. As viewed from above, or in the Z direction, each electrode film 14 is patterned in the same pattern. Hence, the control gate electrodes CG are arranged in a matrix as viewed in the X direction. In FIGS. 1 to 3, the control gate electrode CG formed in the n-th lowest (where n is a natural number) electrode film 14 is denoted as "control gate electrode CGn". In the example illustrated in this embodiment, the number of electrode films 14 stacked in the stacked body ML is four. Hence, the control gate electrode formed in the uppermost electrode film 14 of the stacked body ML (this control gate electrode being hereinafter referred to as "uppermost control gate electrode") is the control gate electrode CG4. On the other hand, the dielectric film 15 is illustratively made of silicon oxide ($SiO_2$), and functions as an interlayer dielectric film for insulating between the electrode films 14.

A dielectric film 16, a conductive film 17, and a dielectric film 18 are formed in this order on the stacked body ML. The conductive film 17 is illustratively made of polysilicon and divided along the Y direction into a plurality of select gate electrodes SG extending in the X direction. Two select gate electrodes SG are provided immediately above each control gate electrode CG4. That is, the select gate electrodes SG extend in the same direction (X direction) as the control gate electrodes CG, but with the arrangement pitch being halved. As described later, the select gate electrodes SG include a select gate electrode SGb on the bit line side and a select gate electrode SGs on the source line side.

In the Z direction (stacking direction), the distance a between the select gate electrode SG and the uppermost control gate electrode CG4 satisfies a relation to the distance b between the control gate electrodes CG of the different layers of the stacked body ML such that a<2b. Preferably, the distance a is less than or equal to the distance b, that is, a≦b.

A dielectric film 19 is provided on the dielectric film 18, and a source line SL extending in the X direction is provided on the dielectric film 19. The source line SL is placed immediately above every other control gate electrode CG4 of the plurality of control gate electrodes CG4 arranged in the Y direction. Furthermore, a dielectric film 20 is provided on the dielectric film 19 so as to cover the source line SL, and a plurality of bit lines extending in the Y direction are provided on the dielectric film 20. The source line SL and the bit line BL are each formed from a metal film.

A plurality of through holes 21 extending in the stacking direction (Z direction) of the layers are formed so as to penetrate through the stacked body ML. Each through hole 21 penetrates through the control gate electrode CG at every stage, and its lower end reaches the back gate BG. The through holes 21 are arranged in a matrix along the X and Y direction. Because the control gate electrode CG extends in the X direction, the through holes 21 arranged in the X direction penetrate through the same control gate electrode CG. The arrangement pitch of the through holes 21 in the Y direction is half the arrangement pitch of the control gate electrodes CG. Thus, two through holes 21 arranged in the Y direction are paired, and the through holes 21 belonging to the same pair penetrate through the same control gate electrode CG.

A communication hole 22 is formed in an upper portion of the back gate BG so as to allow the lower end portion of one through hole 21 to communicate with the lower end portion of another through hole 21 distanced by one row in the Y direction from the former through hole 21. Thus, a pair of through holes adjacent in the Y direction, and the communication hole 22 allowing them to communicate with each other, constitute one continuous U-hole 23. A plurality of U-holes 23 are formed in the stacked body ML.

An ONO film (oxide-nitride-oxide film) 24 is provided on the inner surface of the U-hole 23. The ONO film 24 includes an insulative block layer 25, a charge storage layer 26, and an insulative tunnel layer 27 stacked in this order from outside. The block layer 25 is in contact with the back gate BG, the control gate electrodes CG, and the dielectric films 15. The block layer 25 and the tunnel layer 27 are illustratively made of silicon oxide, and the charge storage layer 26 is illustratively made of silicon nitride.

A semiconductor material, such as polysilicon, doped with impurities is buried inside the U-hole 23. Thus, a U-shaped silicon member 33 is provided inside the U-hole 23. The portion of the U-shaped silicon member 33 located in the through hole 21 is a silicon pillar 31, and the portion located in the communication hole 22 is a connecting member 32. The silicon pillar 31 is shaped like a column, such as a cylindrical column, extending in the Z direction. The connecting member 32 is shaped like a prism, such as a quadrangular prism, extending in the Y direction. Two silicon pillars 31 and one connecting member 32 constituting the U-shaped silicon member 33 is integrally formed. Hence, the U-shaped silicon member 33 is seamlessly and continuously formed along its longitudinal direction. Furthermore, the U-shaped silicon member 33 is insulated from the back gate BG and the control gate electrodes CG by the ONO film 24.

Furthermore, a plurality of through holes 51 are formed in the dielectric film 16, the select gate electrode SG, and the dielectric film 18. Each through hole 51 is formed immediately above one of the through holes 21 in communication therewith. Here, because the select gate electrode SG extends in the X direction, the through holes 51 arranged in the X direction penetrate through the same select gate electrode SG. The arrangement pitch of the through holes 51 in the Y direction is the same as the arrangement pitch of the select gate electrodes SG, and the phase of the arrangement is also the same. Hence, the plurality of through holes 51 arranged in the Y direction are in one-to-one correspondence with the select gate electrodes SG and penetrate through different select gate electrodes SG.

A gate dielectric film 28 is formed on the inner surface of the through hole 51. Furthermore, polysilicon, for instance, is buried inside the through hole 51 to constitute a silicon pillar 34. The silicon pillar 34 is shaped like a column, such as a cylindrical column, extending in the Z direction. The lower end portion of the silicon pillar 34 is connected to the upper end portion of the silicon pillar 31 formed immediately therebelow. Furthermore, the silicon pillar 34 is insulated from the select gate electrode SG. The U-shaped silicon member 33 and a pair of silicon pillars 34 connected to its upper end portion constitute a U-pillar 30.

In the following, the positional relationship among the U-pillar 30, the control gate electrode CG, the select gate electrode SG, the source line SL, and the bit line BL is described.

The U-pillar 30 is configured so that a pair of silicon pillars 34 and 31 adjacent in the Y direction is connected to each other by the connecting member 32. On the other hand, the control gate electrode CG, the select gate electrode SG, and the source line SL extend in the X direction, whereas the bit line BL extends in the Y direction. The arrangement pitch of the U-pillars 30 in the Y direction is the same as that of the control gate electrodes CG, but the phase is shifted by half the pitch. Hence, a pair of silicon pillars 31 belonging to each U-pillar 30, or two silicon pillars 31 connected to each other by the connecting member 32, penetrate different control gate electrodes CG. On the other hand, two adjacent silicon pillars 31 belonging to two U-pillars 30 adjacent in the Y direction penetrate through a common control gate electrode CG.

The plurality of silicon pillars 34 arranged in the Y direction penetrate through different select gate electrodes SG. Hence, a pair of silicon pillars 34 belonging to each U-pillar 30 also penetrates through different select gate electrodes SG. On the other hand, the plurality of U-pillars 30 arranged in the X direction penetrate through a common pair of select gate electrodes SG.

Furthermore, one silicon pillar 34 of a pair of silicon pillars 34 belonging to each U-pillar 30 is connected to the source line SL through a source plug SP buried in the dielectric film 19, and the other silicon pillar 34 is connected to the bit line BL through a bit plug BP buried in the dielectric films 19 and 20. Hence, the U-pillar 30 is connected between the bit line BL and the source line SL. In FIGS. 1 to 3, of the select gate electrodes SG penetrated by the U-pillar 30, the select gate electrode SG located on the bit line side is denoted as select gate electrode SGb, and the select gate electrode SG located on the source line side is denoted as select gate electrode SGs. The U-pillars 30 arranged in the X direction are connected to a common source line, and to different bit lines BL. Here, the arrangement pitch of the U-pillars 30 in the X direction is the same as the arrangement pitch of the bit lines BL. Hence, in the X direction, the U-pillars 30 are in one-to-one correspondence with the bit lines BL. On the other hand, the U-pillars 30 arranged in the Y direction are connected in pairs to the respective source lines SL, and to a common bit line BL.

As shown in FIGS. 1 to 3, in the device 1, the silicon pillar 31 functions as a channel, and the control gate electrode CG functions as a gate electrode. Thus, a vertical memory transistor 35 is formed at the intersection between the silicon pillar 31 and the control gate electrode CG. Each memory transistor 35 functions as a memory cell by storing electrons in the charge storage layer 26 located between the silicon pillar 31 and the control gate electrode CG. The stacked body ML includes a plurality of silicon pillars 31 arranged in a matrix along the X and Y direction. Hence, a plurality of memory transistors 35 are three-dimensionally arranged along the X, Y, and Z direction.

Furthermore, a select transistor 36 with the silicon pillar 34 serving as a channel, the select gate electrode SG serving as a gate electrode, and the gate dielectric film 28 serving as a gate dielectric film is formed at the intersection between the silicon pillar 34 and the select gate electrode SG. Like the aforementioned memory transistor 35, the select transistor 36 is also a vertical transistor.

Furthermore, because the ONO film 24 is interposed between the connecting member 32 and the back gate BG, a back gate transistor 37 with the connecting member 32 serving as a channel, the back gate BG serving as a gate electrode, and the ONO film 24 serving as a gate dielectric film is formed. That is, the back gate BG functions as an electrode for controlling the conduction state of the connecting member 32 by an electric field.

Consequently, as shown in FIG. 3, a memory string 38 connected between the bit line BL and the source line SL is configured along each U-pillar 30. In the memory string 38, the select transistors 36 are provided at both end portions, the back gate transistor 37 is provided at the center, and as many memory transistors 35 are connected in series between each select transistor 36 and the back gate transistor 37 as the number of stacked electrode films 14. That is, the plurality of memory transistors 35 three-dimensionally arranged in the stacked body ML are grouped into the memory string 38 for each U-shaped silicon member 33. In this embodiment, the number of stacked electrode films 14 is four. Hence, the number of memory transistors 35 connected in series between each select transistor 36 and the back gate transistor 37 is four, and the number of memory transistors 35 provided in one memory string 38 is eight.

On the other hand, the peripheral circuit region in the device 1 includes a control potential generation circuit 41, a buffer potential generation circuit 42, and a select potential generation circuit 43. The control potential generation circuit 41 is connectable to the control gate electrodes CG1-CG3, and applies a control potential for controlling the memory transistor 35 to the control gate electrodes CG1-CG3. A switch (not shown) may be interposed between the control potential generation circuit 41 and the control gate electrodes CG1-CG3. Here, as many control potential generation circuits 41 may be provided as the control gate electrodes CG1-CG3 and connected thereto in one-to-one correspondence. Alternatively, they may be fewer than the number of control gate electrodes CG1-CG3 and switchably connected thereto through a switch.

The buffer potential generation circuit 42 is connectable to the uppermost control gate electrode CG4, and applies a different potential (buffer potential) to the uppermost control gate electrode CG4 than the potential (control potential) which the control potential generation circuit 41 applies to the other control gate electrodes CG1-CG3. A switch (not shown) may be interposed between the buffer potential generation circuit 42 and the control gate electrode CG4. Here, as many buffer potential generation circuits 42 may be provided as the control gate electrodes CG4 and connected thereto in one-to-one correspondence. Alternatively, they may be fewer than the number of control gate electrodes CG4 and switchably connected thereto through a switch.

The select potential generation circuit 43 is connectable to the select gate electrode SG, and applies a select potential for turning the select transistor 36 into the ON or OFF state to the select gate electrode SG. A switch (not shown) may be interposed between the select potential generation circuit 43 and the select gate electrode SG. Here, as many select potential generation circuits 43 may be provided as the select gate electrodes SG and connected thereto in one-to-one correspondence. Alternatively, they may be fewer than the number of select gate electrodes SG and switchably connected thereto through a switch.

Next, the operation of the nonvolatile semiconductor memory device 1 according to this embodiment configured as above is described.

FIG. 4 shows potentials applied to each electrode and interconnect in the operation of the nonvolatile semiconductor memory device 1 according to this embodiment.

In this embodiment, of the memory transistors 35 formed in the stacked body ML, the memory transistors 35 formed in the electrode films 14 except the uppermost one are used as memory cells, and data is stored therein. On the other hand, the memory transistor 35 formed in the uppermost electrode film 14 is used as a dummy transistor for electric field buffering, and not used to store data.

In the following description, the memory transistor 35 is assumed to be an n-channel field effect transistor. The state of the memory transistor 35 with electrons stored in the charge storage layer 26 and its threshold shifted positive is defined as value "0", and the state with no electrons stored in the charge storage layer 26 and its threshold not shifted is defined as value "1". Furthermore, the memory transistor 35 under programming and reading of data (hereinafter referred to as "selected cell") is assumed to be the third lowest memory transistor in the silicon pillar with its upper end portion connected to the bit line BL. That is, the third lowest control gate electrode CG3 located in the region outside the immediately underlying region of the source line SL is the gate electrode of the selected cell.

Program Operation

Programming of data is simultaneously performed on a plurality of selected cells arranged in the X direction. As shown in FIG. 1, this plurality of selected cells belong to different memory strings 38, but shares the same control gate electrode CG3. Furthermore, the plurality of memory strings 38 including these selected cells are connected to different bit lines BL, but penetrate through a common select gate electrode SG, and are connected to a common source line SL.

First, the Y coordinate of the memory string 38 (hereinafter referred to as "selected string") including the memory transistor 35 to be programmed (selected cell) is selected. Specifically, as shown in FIG. 4, a select gate potential $V_{sg}$ is applied to the select gate electrode SGb of the selected string, and an OFF potential $V_{off}$ is applied to the select gate electrode SGs. Furthermore, the OFF potential $V_{off}$ is applied to the select gate electrodes SGb and SGs of the non-selected memory string 38. The OFF potential $V_{off}$ is a potential, such as a reference potential Vss, which allows the transistor constituted by the associated gate electrode to be turned into the OFF state. The reference potential Vss is illustratively the ground potential (0 V). The select gate potential $V_{sg}$ is a potential, such as a potential higher than the reference potential Vss, which allows the conduction state of the select transistor 36 constituted by the select gate electrode SG to depend on the potential (body potential) of the silicon pillar. Furthermore, the potential of the back gate BG is set to the ON potential $V_{on}$. The ON potential $V_{on}$ is a potential, such as a supply potential Vdd (e.g., 3.0 V), which allows the transistor constituted by the associated gate electrode to be turned into the ON state.

Thus, the select transistor 36 on the bit line side of the selected string is allowed to switch between the ON state and the OFF state depending on the potential of the bit line BL, and the select transistor 36 on the source line side is turned into the OFF state. The select transistors 36 of the non-selected memory string 38 are all turned into the OFF state. Furthermore, the back gate transistors 37 of all the memory strings 38 are turned into the ON state.

Next, with regard to the bit lines BL, the reference potential Vss (e.g., 0 V) is applied to the bit line BL to which the selected cell to be programmed with value "0" is connected, and the supply potential Vdd (e.g., 3.0 V) is applied to the bit line BL to which the selected cell to be programmed with value "1" is connected. On the other hand, the supply potential Vdd is applied to all the source lines SL.

In this state, the position of the selected cell in the selected string is selected. Specifically, the potential of the control gate electrode CG constituting the selected cell, or the third lowest control gate electrode CG3 located in the region outside the immediately underlying region of the source line SL, is raised to a program potential $V_{pgm}$ (e.g., 18 V), and the potential of the other control gate electrodes CG is set to an intermediate potential $V_{pass}$ (e.g., 10 V). The program potential $V_{pgm}$ is a potential high enough to inject electrons from the silicon pillar 31 into the charge storage layer 26 of the ONO film 24, and is higher than the reference potential Vss and the select gate potential $V_{sg}$. That is, $Vss<V_{sg}<V_{pgm}$. The intermediate potential $V_{pass}$ is higher than the reference potential Vss, but lower than program potential $V_{pgm}$. That is, $Vss<V_{pass}<V_{pgm}$.

At this time, the buffer potential generation circuit 42 applies to the uppermost control gate electrode CG4 a buffer potential, such as the intermediate potential $V_{pass}$ (e.g., 10 V), between the OFF potential $V_{off}$ (e.g., 0 V) applied to the select gate electrodes SGb and SGs of the non-selected memory string 38 and the program potential $V_{pgm}$ (e.g., 18 V) applied to the control gate electrode CG3.

Thus, with regard to the selected cell to be programmed with value "0", the potential of the bit line BL is the reference potential Vss (e.g., 0 V), and the potential of the select gate electrode SGb on the bit line side is the select gate potential $V_{sg}$ higher than the reference potential Vss. Hence, the potential difference between the source potential and the gate potential of the select transistor 36 on the bit line side exceeds its threshold, and this select transistor 36 is turned into the ON state. Consequently, the body potential $V_{body}$ of the selected cell becomes close to the reference potential Vss. Furthermore, the potential of the control gate electrode CG3 is the program potential $V_{pgm}$ (e.g., 18 V). Hence, the difference $(V_{pgm}-V_{body})$ between the gate potential and the body potential in the selected cell becomes sufficiently large, resulting in generating high-temperature electrons, which are injected from the silicon pillar 31 through the tunnel layer 27 into the charge storage layer 26. Thus, this selected cell is programmed with value "0".

On the other hand, with regard to the selected cell to be programmed with value "1", the potential of the bit line BL is the supply potential Vdd (e.g., 3.0 V), and the potential of the select gate electrode SGb on the bit line side is the select gate potential $V_{sg}$ higher than the reference potential Vss. Hence, the potential difference between the source potential and the gate potential of the select transistor 36 on the bit line side is small, and this select transistor 36 is turned into the OFF state by the back gate effect. Thus, the silicon pillar 31 becomes floating, and the body potential $V_{body}$ of the selected cell is maintained at a high value by coupling with the control gate electrode CG subjected to the intermediate potential $V_{pass}$ (e.g., 10 V). Hence, the difference $(V_{pgm}-V_{body})$ between the program potential $V_{pgm}$ (e.g., 18 V) of the control gate electrode CG3 and the body potential $V_{body}$ in the selected cell becomes small, and no electrons are injected into the charge storage layer 26. Consequently, this selected cell is programmed with value "1".

In the non-selected memory string 38, the select transistors 36 at both end portions are turned into the OFF state. Hence, the potential of the silicon pillar 31 becomes floating. In this case, the body potential $V_{body}$ of the silicon pillar 31 can be controlled by the potential applied to the control gate electrode CG and its voltage rise rate, and the potential of the select gate electrode, and can be maintained at a high potential. Consequently, the difference $(V_{pgm}-V_{body})$ between the gate potential and the body potential in the memory transistor 35 becomes small, and no electrons are injected into the charge storage layer 26. Thus, the original value is retained.

At this time, to maintain the body potential $V_{body}$ of the non-selected memory string at a high value, the OFF current of the select transistor 36 needs to be sufficiently low. In the device 1 according to this embodiment, the buffer potential generation circuit 42 applies the intermediate potential $V_{pass}$ to the uppermost control gate electrode CG4. Hence, in the non-selected memory string 38, the electric field between the select transistor 36 in the OFF state and the memory transistor 35 subjected to the program potential $V_{pgm}$ can be relaxed. Thus, the OFF current of the select transistor 36 can be reduced. Consequently, even for a short distance a between the select gate electrode SG and the uppermost control gate electrode CG4, no electrons are injected into the charge storage layer 26 of the memory transistor 35 belonging to the non-selected memory string 38 and subjected to the program potential $V_{pgm}$, and misprogramming can be avoided.

Furthermore, the intermediate potential $V_{pass}$ applied to the uppermost control gate electrode CG4 allows the electric field produced by this uppermost control gate electrode CG4 and the control gate electrode CG3 subjected to the program potential $V_{pgm}$ to trap minority carriers of electron-hole pairs generated in the silicon pillar, thereby preventing the minority carriers from flowing into the select transistor. That is, in the case where the memory transistor 35 is an n-type transistor, the current of holes, which are the minority carriers, can be prevented from flowing into the select transistor 36. This serves to prevent degradation in the cutoff characteristics of the select transistor due to minority carriers.

In contrast, if the dummy transistor is not provided, then among the non-selected memory strings, in at least the memory string sharing the control gate electrode with the selected string, a strong electric field is produced between the select gate electrode SG subjected to the OFF potential $V_{off}$ (e.g., 0 V) and the control gate electrode CG3 subjected to the program potential $V_{pgm}$ (e.g., 18 V). This electric field is particularly strong if the control gate electrode CG subjected to the program potential $V_{pgm}$ is the uppermost control gate electrode CG4 and the distance a is short. Consequently, high-temperature electrons are generated and injected into the charge storage layer 26 of the memory transistor 35 constituted by the control gate electrode CG4. Thus, value "0" is erroneously programmed into the memory transistor 35 of the non-selected memory string, which is not the transistor to be programmed.

Read Operation

As shown in FIG. 4, the ON potential $V_{on}$ is applied to the back gate BG to turn the back gate transistor 37 into the ON state. Furthermore, the ON potential $V_{on}$ (e.g., 3.0 V) is applied to the select gate electrodes SGs and SGb of the selected string to turn the select transistor 36 into the ON state. On the other hand, the OFF potential $V_{off}$ (e.g., 0 V) is applied to the select gate electrodes SGs and SGb of the non-selected memory string 38 to turn the select transistor 36 into the OFF state.

Furthermore, the control gate electrode CG3 of the selected cell is subjected to a potential which allows the conduction state to depend on the value of the selected cell. This potential is a potential, such as the reference potential Vss (e.g., 0 V), such that no current flows through the body if the value of the selected cell is "0", that is, if electrons are stored in the charge storage layer 26 and its threshold is shifted positive, and a current flows through the body if the value of the selected cell is "1", that is, if no electrons are stored in the charge storage layer 26 and its threshold is not shifted. Furthermore, the control gate electrodes CG1 and CG2 constituting the memory transistors 35 except the selected cell, and the control gate electrode CG4 constituting the uppermost memory transistor 35 as a dummy transistor, are subjected to a read potential $V_{read}$ (e.g., 4.5 V) which allows these memory transistors 35 to be turned into the ON state independent of the value thereof.

In this state, a potential Vb1 (e.g., 0.7 V) is applied to each bit line BL, and the reference potential Vss (e.g., 0 V) is applied to each source line SL. Thus, a current flows through the selected string if the value of the selected cell is "1", and no current flows through the selected string if the value of the selected cell is "0". Hence, the value of the selected cell can be read by detecting the current flowing from the bit line BL through the selected string to the source line SL, or detecting the potential drop of the bit line BL. Here, no current flows through the non-selected memory string 38 irrespective of the value stored in the memory transistor 35, because the select transistor 36 is in the OFF state.

Erase Operation

Erasure of data is performed block by block, each composed of a plurality of memory strings 38.

As shown in FIG. 4, the ON potential $V_{on}$ is applied to the back gate BG to turn the back gate transistor 37 into the ON state. Furthermore, the reference potential Vss (e.g., 0 V) is applied to all the control gate electrodes CG of the block to be erased. At this time, the control gate electrode CG4 of the uppermost memory transistor 35 used as a dummy transistor, like the other control gate electrodes CG1-CG3, is set to the reference potential Vss. Furthermore, the potential of the bit line BL and the source line SL is raised to an erase potential $V_{erase}$ (e.g., 15 V). Moreover, the select gate potential $V_{sg}$ lower than the erase potential $V_{erase}$ is applied to the select gate electrodes SGb and SGs. That is, $V_{sg} < V_{erase}$.

Thus, the potential of the bit line BL and the source line SL is the erase potential $V_{erase}$ (e.g., 15 V), and the potential of the select gate electrodes SGb and SGs is the select gate potential $V_{sg}$. Hence, a hole current is generated by interband tunneling due to the potential difference between the bit line BL and the select gate electrode SGb and the potential difference between the source line SL and the select gate electrode SGs, thus raising the potential of the silicon pillar 31, or the body potential. On the other hand, the reference potential Vss (e.g., 0 V) is applied to the control gate electrode CG of the block to be erased (selected block). Hence, holes are injected into the charge storage layer 26 of the memory transistor 35 by the potential difference between the silicon pillar 31 and the control gate electrode CG, annihilating electrons in the charge storage layer 26. Consequently, data is erased. Here, injection of hole current raises the body potential. Hence, to sufficiently inject holes into the charge storage layer 26, it is necessary to provide a sufficient potential difference between the erase potential $V_{erase}$ and the select gate potential $V_{sg}$.

On the other hand, in the block not to be erased (non-selected block), the potential of the select gate electrodes SGb and SGs is raised close to the potential of the bit line BL and the source line SL to weaken the electric field between the diffusion layer connected to the bit line BL or the source line SL and the select gate electrode SGb or SGs, thereby avoiding the generation of hole current. Alternatively, the potential of the control gate electrode CG is raised simultaneously with the silicon pillar 31 to prevent holes in the silicon pillar 31 from being injected into the charge storage layer 26. Thus, in the non-selected block, the value already programmed in the memory transistor 35 is retained unchanged.

Next, a method for manufacturing the nonvolatile semiconductor memory device 1 according to this embodiment is described.

FIGS. 5 to 13 are process cross-sectional views illustrating the method for manufacturing the nonvolatile semiconductor memory device according to this embodiment.

Here, FIGS. 5 to 13 show the same cross section as FIG. 2.

Figure 5:
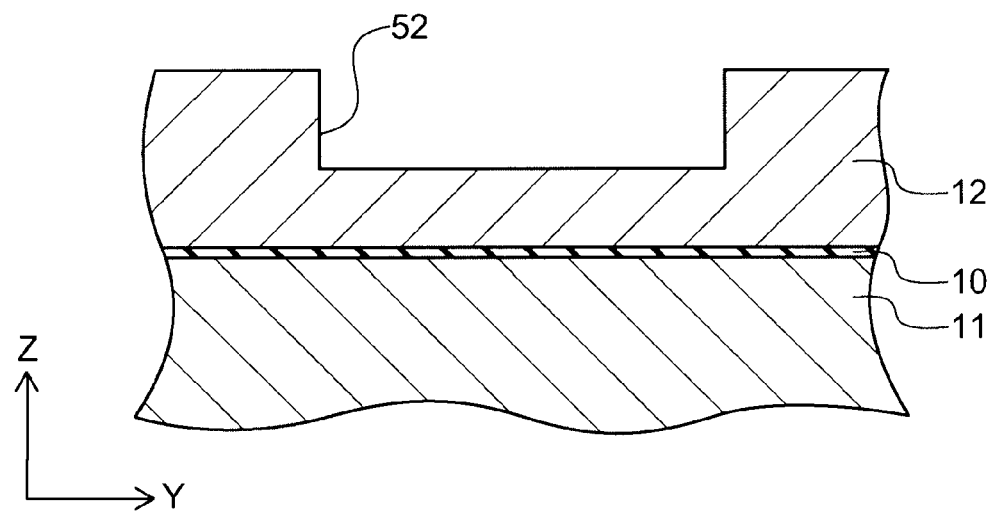
FIGS. 5 to 13 are process cross-sectional views illustrating a method for manufacturing the nonvolatile semiconductor memory device according to the embodiment of the invention.

First, as shown in FIG. 5, a silicon substrate 11 is prepared. A memory cell formation region is defined in this silicon substrate 11, and a peripheral circuit region (not shown) is defined around the memory cell formation region. In the peripheral circuit region, device separation films for forming peripheral circuits, such as a control potential generation circuit 41, a buffer potential generation circuit 42, and a select potential generation circuit 43 (see FIG. 3 for all of them), are formed. Next, in the peripheral circuit region, thick gate dielectric films for high-voltage transistors and thin gate dielectric films for low-voltage transistors are separately formed. At this time, also in the memory cell formation region, a dielectric film 10 is formed on the silicon substrate 11.

Next, a polysilicon film 12 as a conductive film is deposited to a thickness of 200 nm on the dielectric film 10. Then, in the memory cell formation region, photolithography and RIE (reactive ion etching) are performed on the upper portion of the polysilicon film 12 so that a plurality of strip-shaped trenches 52 extending in the Y direction are formed in the upper surface of the polysilicon film 12. The trenches 52 are arranged in a matrix along the X and Y direction. The trench 52 is a depression formed in the upper surface of the polysilicon film 12.

Figure 6:
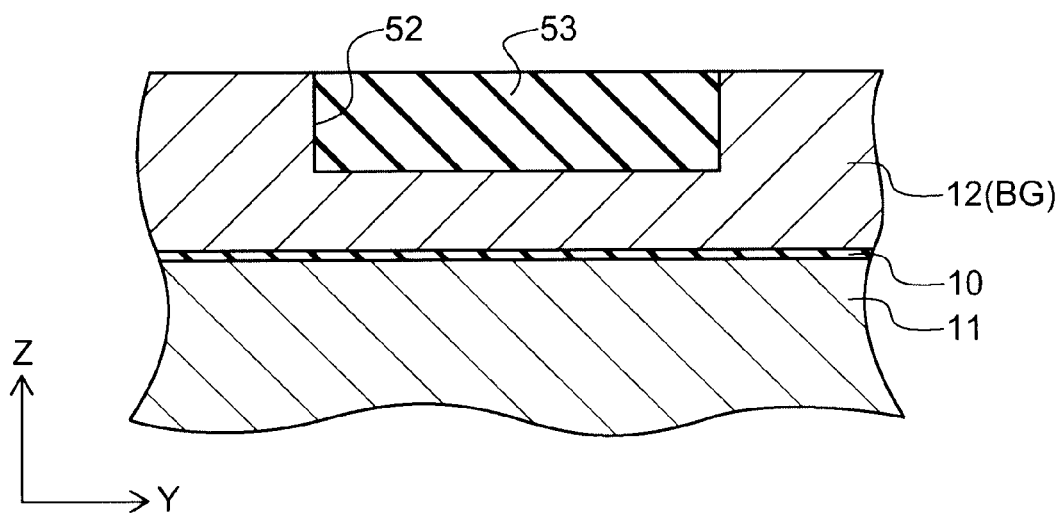

Next, as shown in FIG. 6, a silicon nitride film is deposited illustratively by the CVD (chemical vapor deposition) method to form a sacrificial film 53 on the polysilicon film 12. At this time, the sacrificial film 53 is buried also in the trench 52. Next, the sacrificial film 53 and the polysilicon film 12 are patterned illustratively by photolithography and RIE. Thus, in the memory cell formation region, the polysilicon film 12 is divided into blocks to form a plate-like back gate BG made of the polysilicon film 12 in each block, and in the peripheral circuit region, a gate electrode made of the polysilicon film 12 is formed.

Subsequently, in the peripheral circuit region, a spacer made of silicon oxide is formed, and ion implantation is performed to form a diffusion layer. Next, in the peripheral circuit region, an interlayer dielectric film is deposited, planarized, and recessed so that its upper surface is as high as the upper surface of the polysilicon film 12. Next, the sacrificial film 53 is recessed so as to be removed from above the polysilicon film 12 and left only inside the trench 52.

Figure 7:
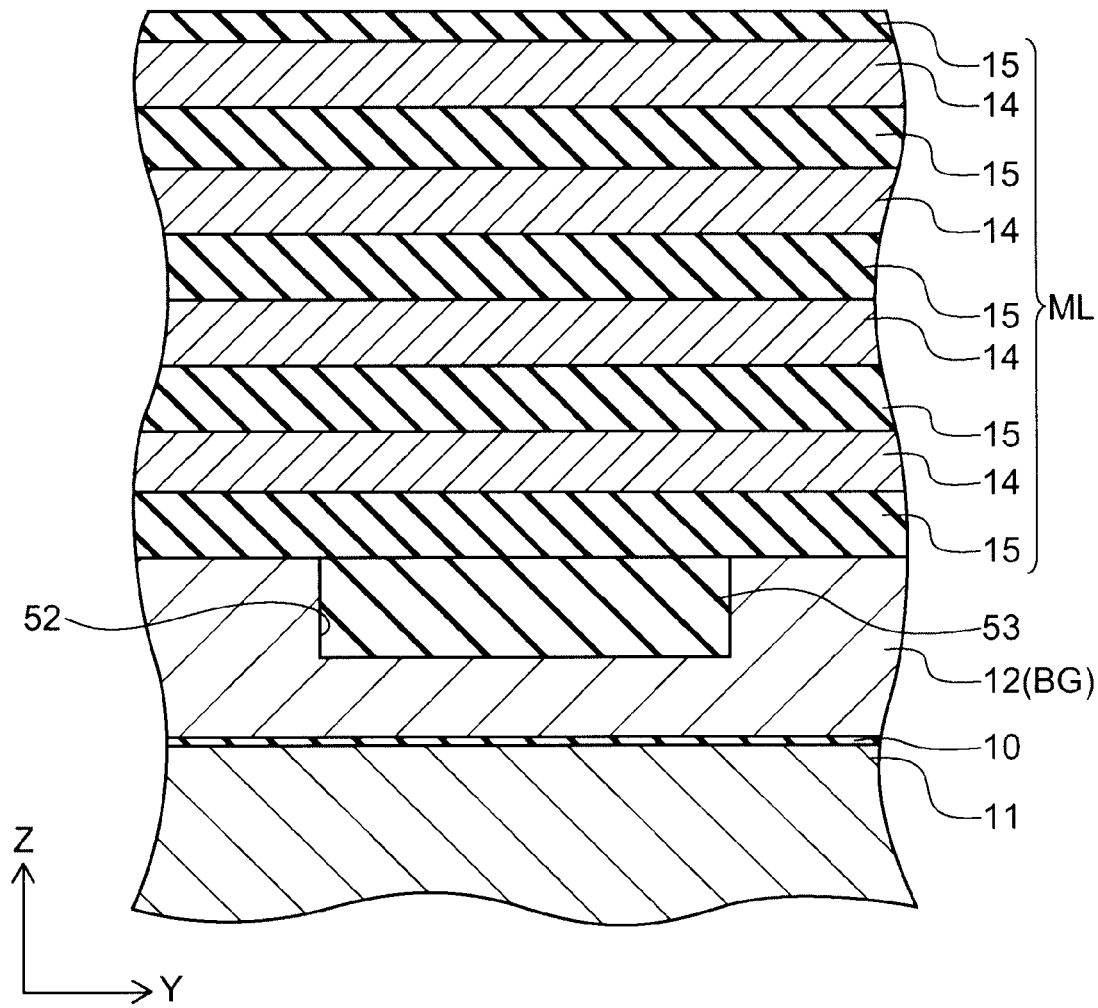

Next, as shown in FIG. 7, in the memory cell formation region, dielectric films 15 illustratively made of silicon oxide and electrode films 14 illustratively made of polysilicon are alternately deposited on the back gate BG (polysilicon film 12) to form a stacked body ML.

Figure 8:
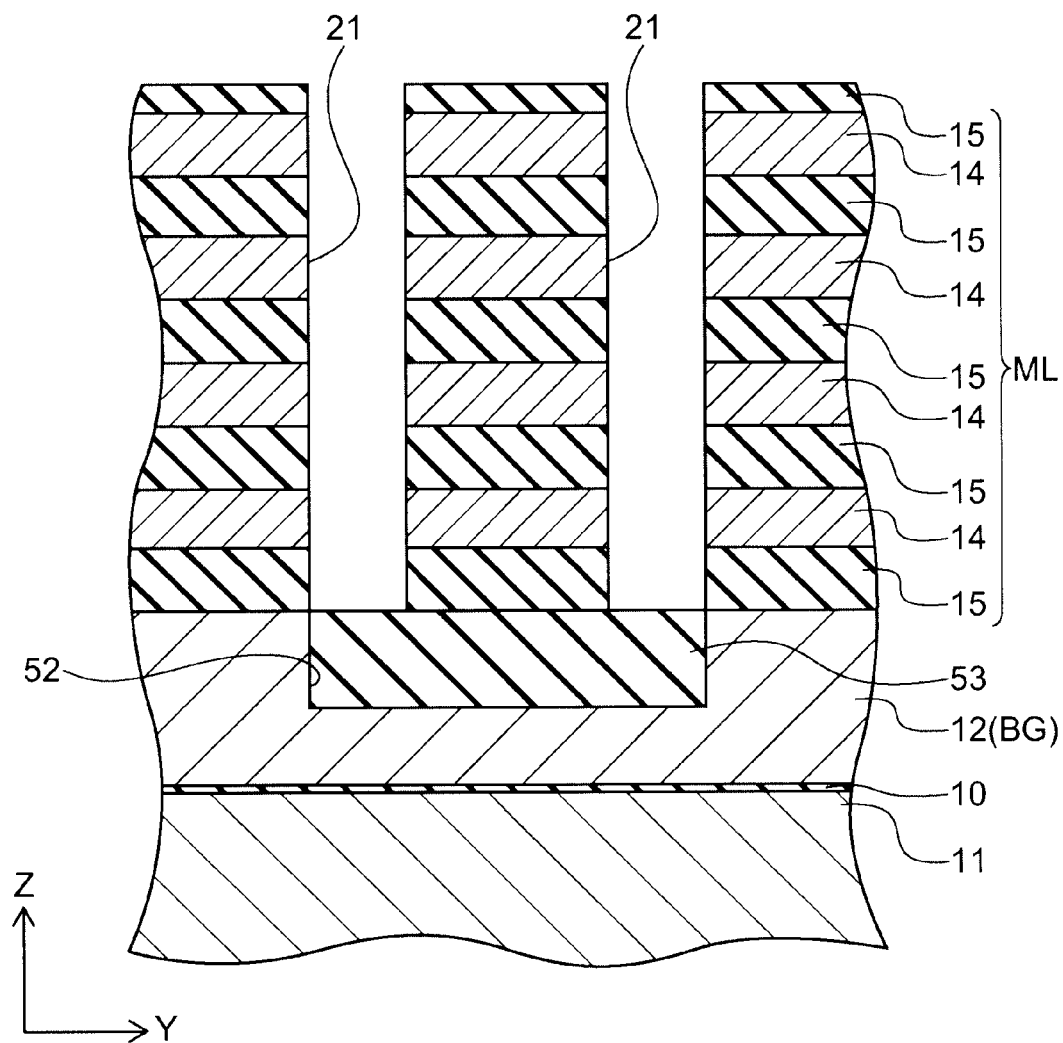

Next, as shown in FIG. 8, a plurality of through holes 21 extending in the Z direction are simultaneously formed in the stacked body ML illustratively by RIE. Here, the through holes 21 are arranged in a matrix along the X and Y direction. The bottom of the through hole 21 is extended to both end portions of the sacrificial film 53 buried in the trench 52. Thus, two through holes 21 adjacent in the Y direction are extended to each sacrificial film 53.

Figure 9:
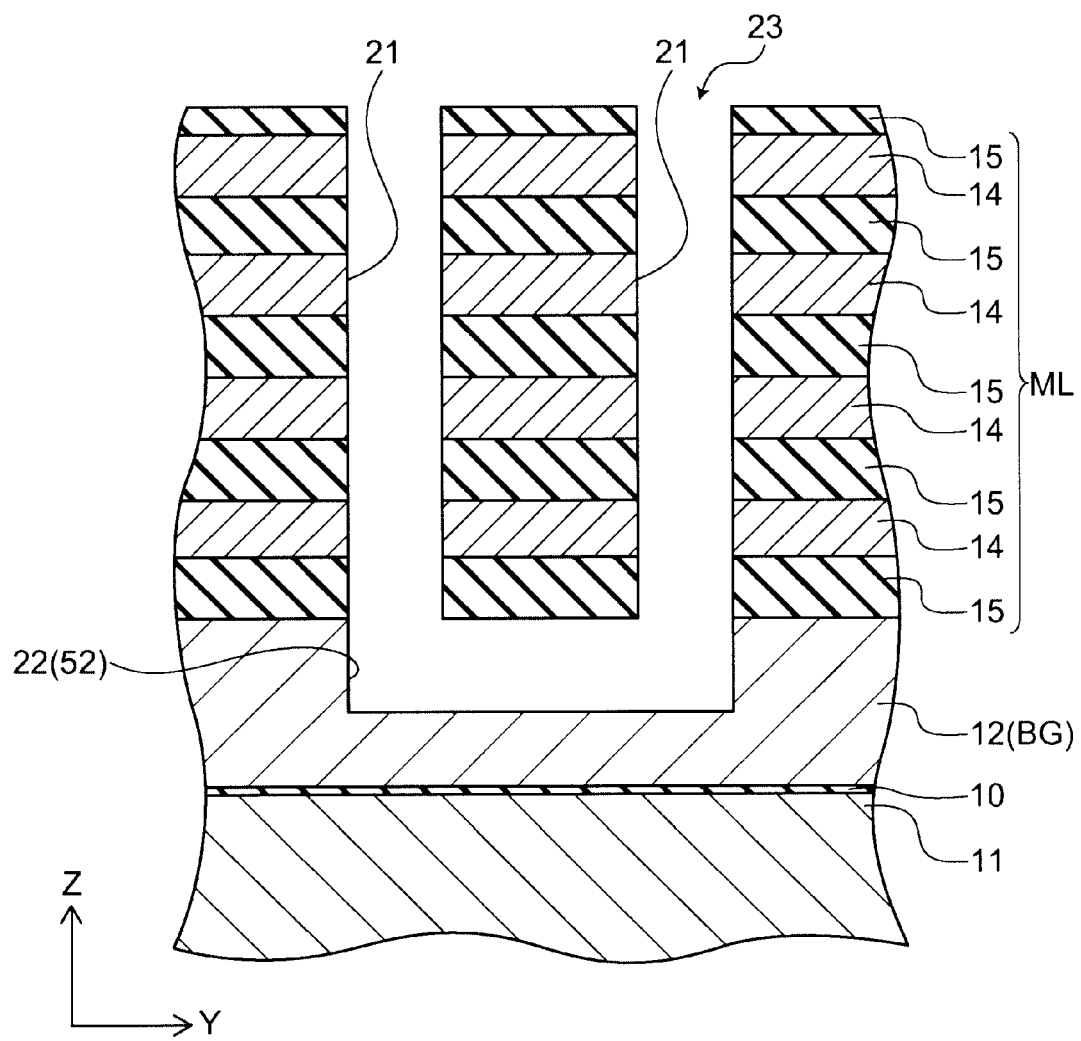

Next, as shown in FIG. 9, wet etching is performed through the through holes 21 to remove the sacrificial film 53 (see FIG. 8) in the trench 52. Thus, the trench 52 turns to a communication hole 22, and one continuous U-hole 23 is formed from the communication hole 22 and the two through holes 21 communicating with its both end portions.

Figure 10:
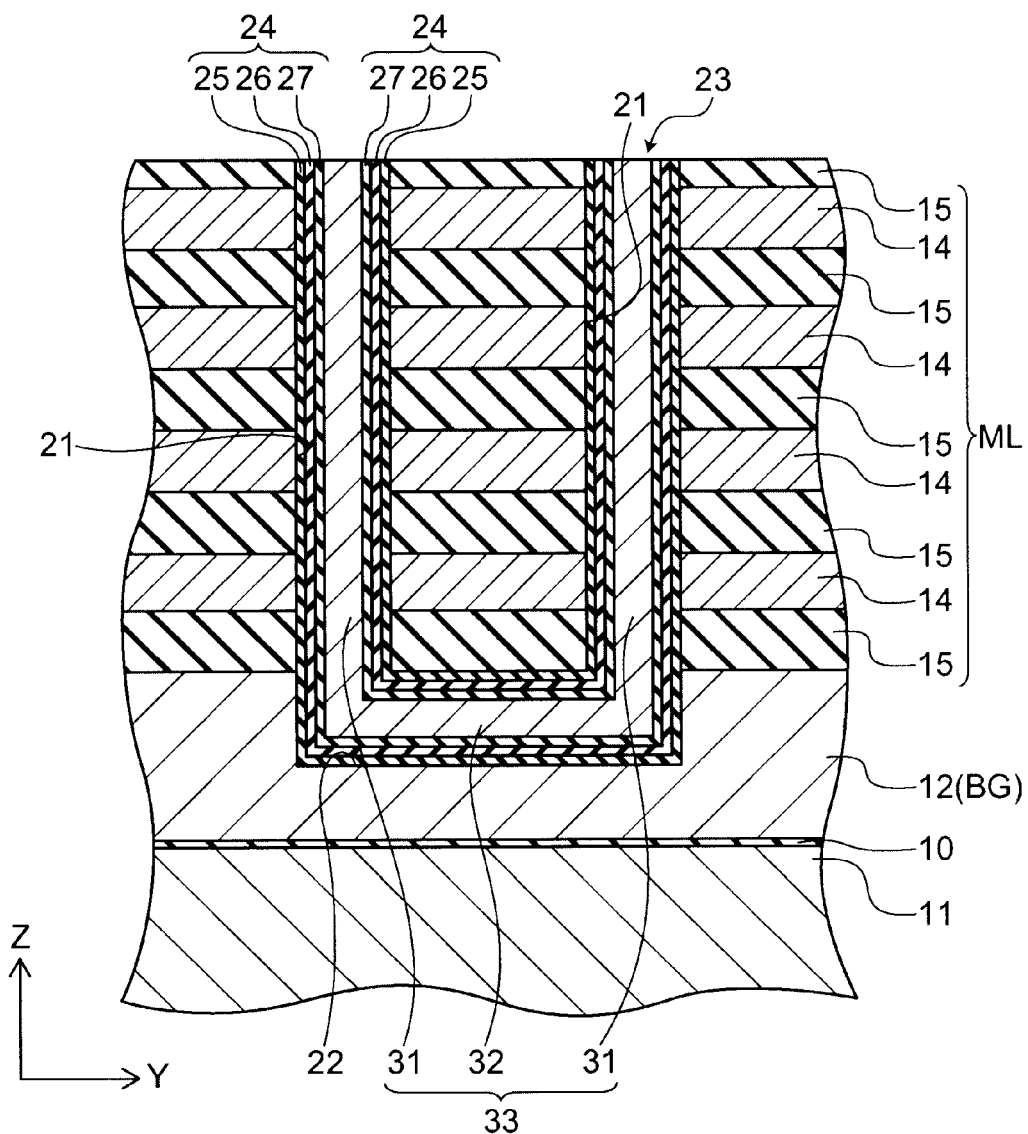

Next, as shown in FIG. 10, a silicon oxide film, a silicon nitride film, and a silicon oxide film are successively deposited. Thus, a block layer 25 made of the silicon oxide film, a charge storage layer 26 made of the silicon nitride film, and a tunnel layer 27 made of the silicon oxide film are laminated in this order on the inner surface of the U-hole 23 to form an ONO film 24.

Next, amorphous silicon is deposited on the entire surface. Thus, amorphous silicon is buried in the U-hole 23 to form a U-shaped silicon member 33. The U-shaped silicon member 33 is composed of a pair of silicon pillars 31 buried in the through holes 21 and one connecting member 32 buried in the communication hole 22. Subsequently, the amorphous silicon, the silicon oxide film, the silicon nitride film, and the silicon oxide film deposited on the stacked body ML are removed.

Figure 11:
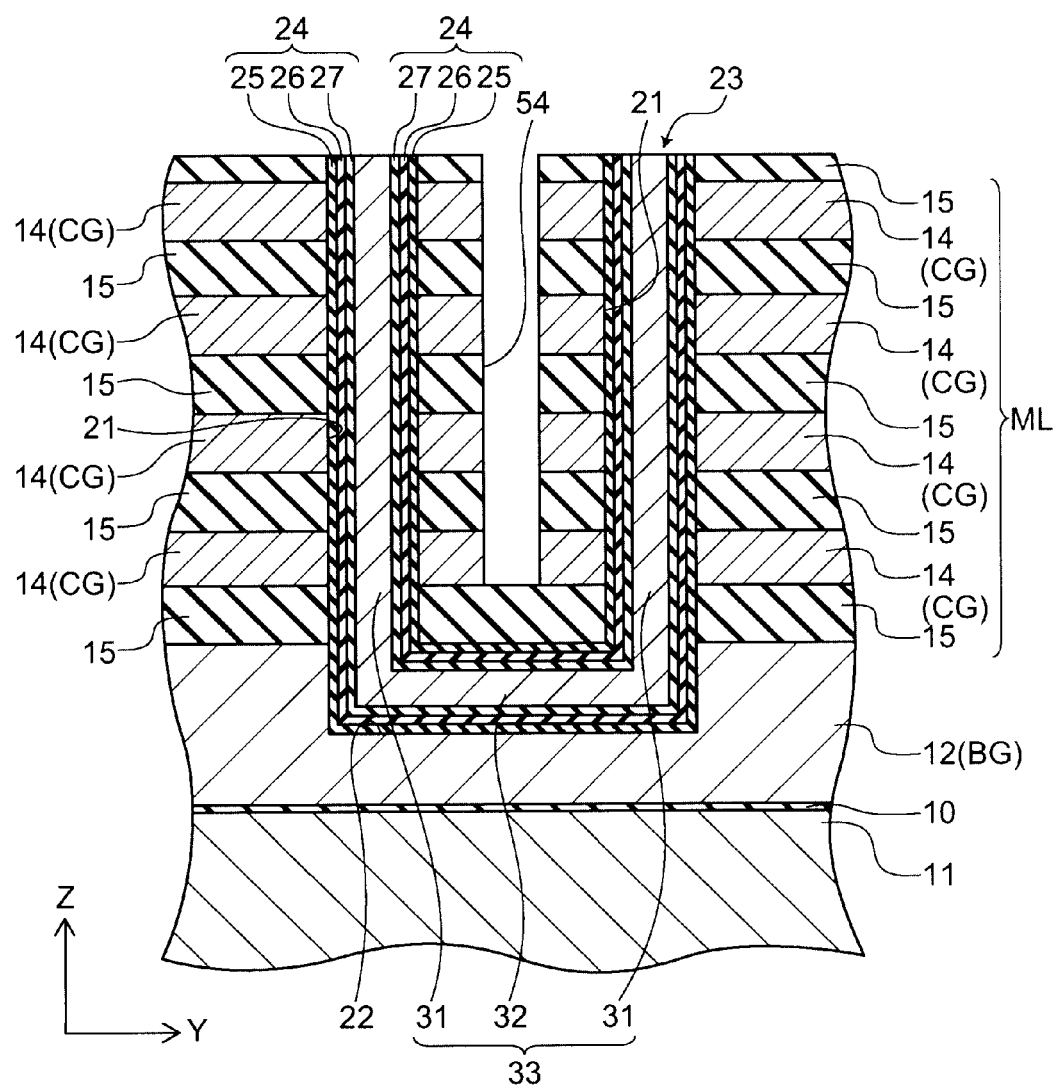

Next, as shown in FIG. 11, the stacked body ML is patterned illustratively by RIE to form a trench 54 in the stacked body ML. The trench 54 is formed so as to extend to the lowermost dielectric film 15 in the X direction in the region between the two silicon pillars 31 connected to the connecting member 32. The electrode film 14 is divided along the Y direction by the trench 54 into a plurality of control gate electrodes CG extending in the X direction.

Figure 12:
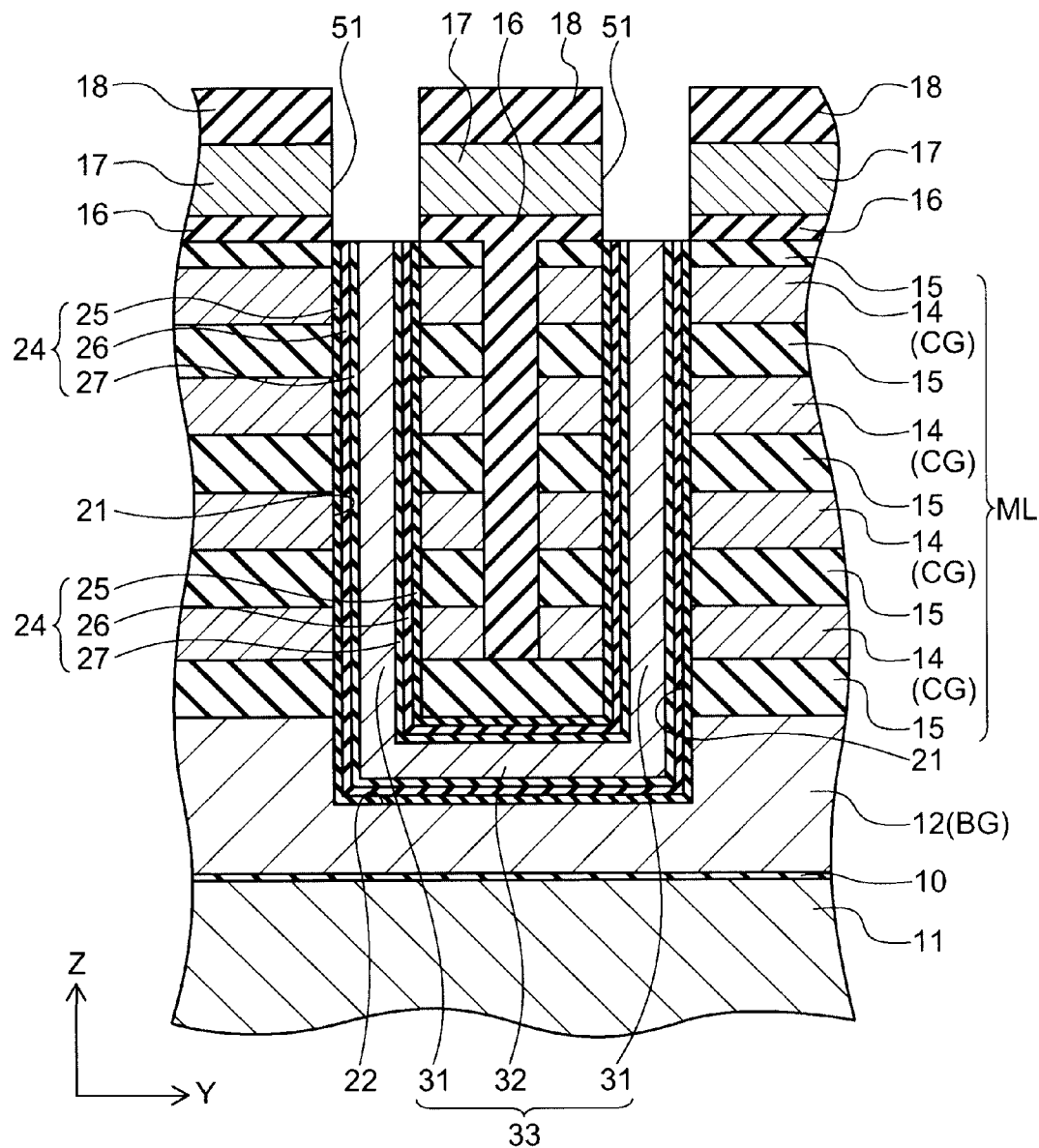

Next, as shown in FIG. 12, a dielectric film 16 is deposited on the stacked body ML, and planarized. The dielectric film 16 is buried also in the trench 54. Next, a conductive film 17 illustratively made of amorphous silicon is deposited, and etched so as to be left only in the memory cell region.

Next, for instance, a resist film (not shown) is formed on the conductive film 17. The stacked body ML is patterned into a staircase shape by repeating the step of etching using this resist film as a mask and the step of slimming the resist film. Thus, as viewed from above (Z direction), both X-direction end portions of the control gate electrode CG at each stage are not covered with the control gate electrodes CG at higher stages, allowing a contact to be formed from above to the control gate electrode CG at each stage in a later process. Next, an etching stopper film (not shown) illustratively made of silicon nitride is formed so as to cover the stacked body ML patterned into a staircase shape. An interlayer dielectric film (not shown) is formed thereon, and its upper surface is planarized. Thus, the interlayer dielectric film is buried around the stacked body ML.

Subsequently, a dielectric film 18 is formed on the conductive film 17. Then, through holes 51 are formed so as to penetrate through the dielectric film 18, the conductive film 17, and the dielectric film 16 and reach the upper end of the through holes 21 in the stacked body ML.

Figure 13:
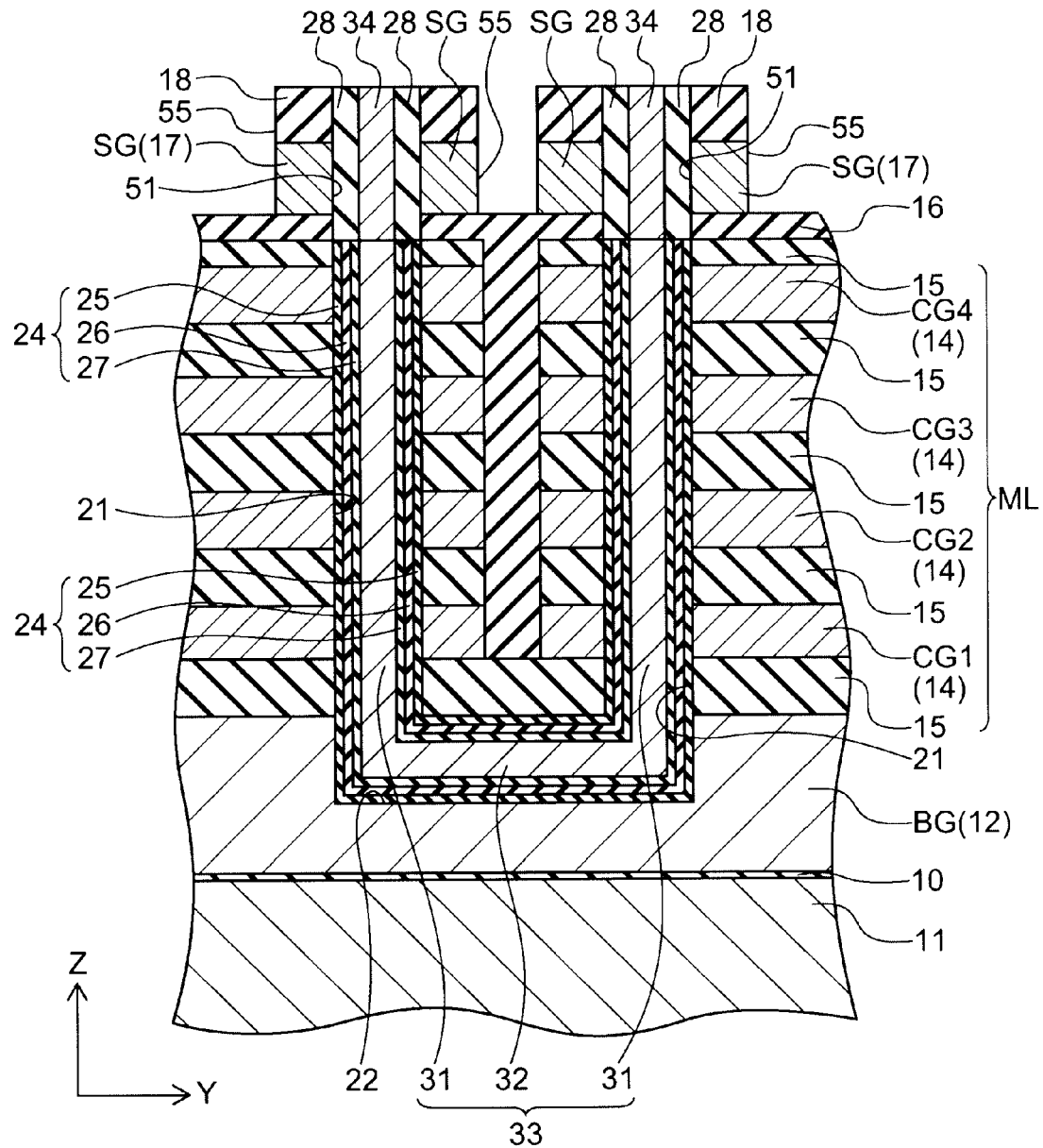

Next, as shown in FIG. 13, a dielectric film is deposited on the entire surface, and amorphous silicon is deposited. Then, the amorphous silicon and the dielectric film are etched back and left only in the through hole 51. Thus, a gate dielectric film 28 is formed on the inner surface of the through hole 51, and amorphous silicon is buried therein. Next, heat treatment is performed at a temperature of e.g. 600° C. so that the amorphous silicon in the through hole 51 is crystallized into polysilicon. Then, arsenic (As) is ion-implanted into this polysilicon illustratively at an acceleration voltage of 40 keV and a dose amount of $3 \times 10^{15}$ cm$^{-2}$ to form a drain diffusion layer (not shown). Thus, a silicon pillar 34 is formed in the through hole 51. The silicon pillar 34 is connected to the silicon pillar 31.

Next, the dielectric film 18 and the conductive film 17 are patterned by RIE and the like so that a trench 55 extending in the X direction is formed in a region between the silicon pillars 34 adjacent in the Y direction. Thus, the conductive film 17 is divided along the Y direction into a plurality of select gate electrodes SG extending in the X direction.

Next, as shown in FIG. 2, a dielectric film 19 is formed on the dielectric film 18. A source plug SP is buried in the dielectric film 19, and source lines SL extending in the X direction are formed on the dielectric film 19. At this time, the source lines SL are connected to the drain diffusion layer of a subset of the silicon pillars 34 through the source plug SP. Furthermore, contacts (not shown) connected to the respective control gate electrodes CG and the respective select gate electrodes SG are formed from above in the interlayer dielectric film (not shown) provided around the stacked body ML. Next, a dielectric film 20 is formed on the dielectric film 19 so as to cover the source line SL. Next, a bit plug BP is buried in the dielectric films 20 and 19, and bit lines BL extending in the Y direction are formed on the dielectric film 20. At this time, the bit lines BL are connected to the drain diffusion layer of the remaining silicon pillars 34 through the bit plug BP. Thus, the nonvolatile semiconductor memory device 1 is manufactured.

Next, the effect of this embodiment is described.

According to this embodiment, the control gate electrodes CG1-CG3 except the uppermost one in the stacked body ML are connected to the control potential generation circuit 41, and the uppermost control gate electrode CG4 is connected to the buffer potential generation circuit 42. Hence, a different potential can be applied to the uppermost control gate electrode CG4 than that applied to the other control gate electrodes CG1-CG3. Thus, in the program operation, the uppermost memory transistor 35 can be used as a dummy transistor. That is, the uppermost control gate electrode CG4 can be subjected to an intermediate potential between the OFF potential $V_{off}$ (e.g., 0 V) applied to the select gate electrodes SGb and SGs of the non-selected memory string 38 and the program potential $V_{pgm}$ (e.g., 18 V) applied to the control gate electrode CG3. This serves to relax the electric field between the select transistor 36 and the memory transistor 35 in the non-selected U-pillar 30 and avoid misprogramming in the non-selected memory string.

This relaxation of electric field allows the distance a between the select gate electrode SG and the uppermost control gate electrode CG4 in the Z direction to be decreased to, for instance, less than or equal to the distance b between the control gate electrodes CG in the Z direction. Consequently, the resistance of the portion of the silicon pillar (connecting portion) between the select transistor 36 and the memory transistor 35 is reduced, which can facilitate reading data. In other words, in this embodiment, the uppermost memory transistor 35 is used as a dummy transistor, and hence, even if the distance a is decreased to reduce the resistance of the connecting portion to facilitate reading data, the electric field in the connecting portion is not increased accordingly, and misprogramming can be avoided in the non-selected memory string sharing the control gate electrode with the selected string. Thus, this embodiment can realize a nonvolatile semiconductor memory device with high operational reliability which can prevent misprogramming of data and facilitate reading data.

To reduce the resistance of the connecting portion, it is also considered to increase impurity concentration in the connecting portion instead of decreasing the distance a. However, in this method, electrons accelerated by the electric field generate electron-hole pairs in the silicon pillar, and the holes thereof serve as minority carriers, causing the problem of degradation in the cutoff characteristics of the select transistor 36. This increases the OFF current of the select transistor 36, and makes it difficult to keep the body potential of the silicon pillar. Furthermore, if the impurity concentration in the connecting portion is increased, then during the erase operation, impurities act as a potential barrier in injecting holes into the charge storage layer, which hinders the erase operation.

Furthermore, according to this embodiment, the memory string 38 is formed from a U-shaped U-pillar 30. Hence, the uppermost memory transistor 35 can be used as a dummy transistor provided at both end portions of the memory string 38. This serves to achieve commonality of the control gate electrode CG4 of the dummy transistor, and avoid increasing the processes for forming the dummy transistor.

Furthermore, in this embodiment, the U-shaped silicon member 33 is integrally and seamlessly formed by burying polysilicon inside the U-hole 23. Thus, in contrast to the stacked memory device described in, e.g., JP-A-2007-266143 (Kokai), there is no need to provide silicon-to-silicon contact in the lower portion of the through holes 21. Hence, there is no need for preprocessing, such as hydrofluoric acid treatment, to remove natural oxide film and the like from the surface of the previously formed silicon member, thus avoiding damage to the charge storage layer due to such preprocessing. Consequently, this embodiment can realize a nonvolatile semiconductor memory device with high reliability in the charge storage layer and high flexibility in the film composition of the charge storage layer.

Furthermore, according to this embodiment, in contrast to the stacked memory device described in JP-A-2007-266143 (Kokai), the source line can be formed as a metal interconnect placed above the stacked body ML rather than a diffusion layer formed in the silicon substrate. Thus, the resistance of the source line can be reduced, which facilitates reading data. Furthermore, there is no increase of impurity concentration in the silicon pillar which may occur if the source line is formed from a diffusion layer, because impurities contained in this diffusion layer are desorbed into vapor phase and reattached to the silicon pillar during its deposition. Hence, there is no degradation in the cutoff characteristics of the transistor due to the increase of impurity concentration in the silicon pillar. Furthermore, because the source line is placed above the stacked body ML, the via for connection to the source line can be made shallower, which facilitates fabrication of the vias. Furthermore, this allows the via to be thinned, and hence a plurality of source lines can be formed for each silicon pillar.

Furthermore, according to this embodiment, the memory string is formed into a U-shape, and the source line is placed above the stacked body ML. Thus, the select gate electrode SGs on the source line side can also be placed above the stacked body ML. Hence, the via for connecting the upper interconnect to the select gate electrode SGs can be made shorter, and can be made thinner with the aspect ratio kept low. Consequently, like the select gate electrode SGb on the bit line side, the select gate electrode SGs on the source line side can be divided for each silicon pillar, and the divided electrodes can be driven independently. Thus, the operational flexibility of the device 1 is improved. For instance, in the read operation, only the silicon pillar of the selected string, rather than all the memory strings, can be connected to the source line SL. This serves to reduce the disturb time during reading.

The invention has been described with reference to the embodiment. However, the invention is not limited to this embodiment. For instance, those skilled in the art can suitably modify the above embodiment by addition, deletion, or design change of components, or by addition, omission, or condition change of processes, and such modifications are also encompassed within the scope of the invention as long as they fall within the spirit of the invention. For instance, in the above embodiment, the description of peripheral circuits except the potential generation circuits 41-43 is omitted. However, in practice, various circuits for driving memory transistors and the like are provided. Furthermore, in the above embodiment, the description of process films, such as an etching stopper film and a diffusion prevention film, is omitted. However, these process films can be suitably formed as needed in the process. Furthermore, planarization, cleaning, and other steps can be suitably provided between the aforementioned steps.

The invention claimed is:

1. A nonvolatile semiconductor memory device comprising:
 a stacked body with a plurality of dielectric films and electrode films alternately stacked therein, the electrode film being divided into a plurality of control gate electrodes extending in one direction;
 a plurality of select gate electrodes provided on the stacked body and extending in the one direction;
 a plurality of semiconductor pillars extending in a stacking direction of the stacked body and penetrating through the control gate electrodes and the select gate electrode;
 a plurality of source lines extending in the one direction and connected to an upper end portion of a subset of the semiconductor pillars;
 a plurality of bit lines extending in a direction crossing the one direction and connected to an upper end portion of the remaining semiconductor pillars;
 a connecting member interconnecting between a lower end portion of one of the semiconductor pillars with the upper end portion connected to the source line and a lower end portion of another of the semiconductor pillars with the upper end portion connected to the bit line;
 a charge storage layer provided between the control gate electrode and the semiconductor pillar; and
 a gate dielectric film provided between the select gate electrode and the semiconductor pillar,
 a different potential being applicable to uppermost one of the control gate electrodes than that applied to the other control gate electrodes.

2. The memory device according to claim 1, wherein in operation of programming data, an intermediate potential between a potential of the select gate electrode penetrated by the same semiconductor pillar as the uppermost control gate electrode and a potential of the other control gate electrodes penetrated by the same semiconductor pillar as the uppermost control gate electrode is applied to the uppermost control gate electrode.

3. The memory device according to claim 2, wherein in the stacking direction of the stacked body, a distance between the select gate electrode and the uppermost control gate electrode is less than or equal to a distance between the control gate electrodes.

4. The memory device according to claim 1, wherein in operation of programming data, a potential between a potential applied to the select gate electrode of a non-selected memory string and a potential applied to the control gate electrode of a memory cell to be programmed with the data is applied to the uppermost control gate electrode.

5. The memory device according to claim 4, wherein in the stacking direction of the stacked body, a distance between the select gate electrode and the uppermost control gate electrode is less than or equal to a distance between the control gate electrodes.

6. The memory device according to claim 1, wherein in the stacking direction of the stacked body, a distance between the select gate electrode and the uppermost control gate electrode is less than or equal to a distance between the control gate electrodes.

7. The memory device according to claim 1, wherein a lower portion of a pair of the interconnected semiconductor pillars and the connecting member are integrally formed from the same material.

8. The memory device according to claim 1, wherein the two semiconductor pillars interconnected by the connecting member penetrate through different ones of the control gate electrodes and are adjacent in the crossing direction, and the two semiconductor pillars not interconnected by the connecting member penetrate through a common one of the control gate electrodes.

9. A nonvolatile semiconductor memory device comprising:
 a stacked body with a plurality of dielectric films and electrode films alternately stacked therein, the electrode film being divided into a plurality of control gate electrodes extending in one direction;

a plurality of select gate electrodes provided on the stacked body and extending in the one direction;

a plurality of semiconductor pillars extending in a stacking direction of the stacked body and penetrating through the control gate electrodes and the select gate electrode;

a plurality of source lines extending in the one direction and connected to an upper end portion of a subset of the semiconductor pillars;

a plurality of bit lines extending in a direction crossing the one direction and connected to an upper end portion of the remaining semiconductor pillars;

a connecting member interconnecting between a lower end portion of one of the semiconductor pillars with the upper end portion connected to the source line and a lower end portion of another of the semiconductor pillars with the upper end portion connected to the bit line;

a charge storage layer provided between the control gate electrode and the semiconductor pillar;

a gate dielectric film provided between the select gate electrode and the semiconductor pillar;

a first potential generation circuit configured to apply a control potential to the control gate electrodes other than the uppermost one of the control gate electrodes; and a second potential generation circuit configured to apply a different potential to the uppermost control gate electrode than the control potential.

10. The memory device according to claim 9, wherein in operation of programming data, an intermediate potential between a potential of the select gate electrode penetrated by the same semiconductor pillar as the uppermost control gate electrode and a potential of the other control gate electrodes penetrated by the same semiconductor pillar as the uppermost control gate electrode is applied to the uppermost control gate electrode.

11. The memory device according to claim 9, wherein in the stacking direction of the stacked body, a distance between the select gate electrode and the uppermost control gate electrode is less than or equal to a distance between the control gate electrodes.

12. The memory device according to claim 9, wherein in operation of programming data, a potential between a potential applied to the select gate electrode of a non-selected memory string and a potential applied to the control gate electrode of a memory cell to be programmed with the data is applied to the uppermost control gate electrode.

13. The memory device according to claim 12, wherein in the stacking direction of the stacked body, a distance between the select gate electrode and the uppermost control gate electrode is less than or equal to a distance between the control gate electrodes.

14. The memory device according to claim 9, wherein in the stacking direction of the stacked body, a distance between the select gate electrode and the uppermost control gate electrode is less than or equal to a distance between the control gate electrodes.

15. The memory device according to claim 9, wherein a lower portion of a pair of the interconnected semiconductor pillars and the connecting member are integrally formed from the same material.

16. The memory device according to claim 9, wherein the two semiconductor pillars interconnected by the connecting member penetrate through different ones of the control gate electrodes and are adjacent in the crossing direction, and the two semiconductor pillars not interconnected by the connecting member penetrate through a common one of the control gate electrodes.

17. The memory device according to claim 9, further comprising:
    a semiconductor substrate including a memory cell formation region and a peripheral circuit region,
    the stacked body being placed in the memory cell formation region, and
    the first potential generation circuit and the second potential generation circuit being placed in the peripheral circuit region.

* * * * *